(12) United States Patent
Creyghton et al.

(10) Patent No.: US 11,610,764 B2
(45) Date of Patent: Mar. 21, 2023

(54) PLASMA SOURCE AND METHOD OF OPERATING THE SAME

(71) Applicant: Nederlandse Organisatie voor toegepast-natuurwetenschappelijk onderzoek TNO, 's-Gravenhage (NL)

(72) Inventors: Yves Lodewijk Maria Creyghton, Delft (NL); Andries Rijfers, Kamerik (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 289 days.

(21) Appl. No.: 17/254,173

(22) PCT Filed: Jun. 20, 2019

(86) PCT No.: PCT/NL2019/050383
§ 371 (c)(1),
(2) Date: Dec. 18, 2020

(87) PCT Pub. No.: WO2019/245372
PCT Pub. Date: Dec. 26, 2019

(65) Prior Publication Data
US 2021/0296094 A1 Sep. 23, 2021

(30) Foreign Application Priority Data

Jun. 21, 2018 (EP) .................................... 18179096

(51) Int. Cl.
*H01J 37/32* (2006.01)
(52) U.S. Cl.
CPC .. *H01J 37/32348* (2013.01); *H01J 37/32385* (2013.01); *H01J 37/32449* (2013.01); *H01J 37/32541* (2013.01); *H01J 37/32568* (2013.01)

(58) Field of Classification Search
None
See application file for complete search history.

(56) References Cited

U.S. PATENT DOCUMENTS

| | | | |
|---|---|---|---|
| 4,724,508 A | 2/1988 | Macy | |
| 6,652,069 B2 | 11/2003 | Toda et al. | |
| (Continued) | | | |

FOREIGN PATENT DOCUMENTS

| | | |
|---|---|---|
| DE | 2834366 A1 | 2/1980 |
| EP | 2362411 A1 | 8/2011 |
| (Continued) | | |

OTHER PUBLICATIONS

European Patent Office, International Search Report in corresponding International Application No. PCT/NL2019/050383, dated Aug. 28, 2019 (3 pages).

(Continued)

*Primary Examiner* — Srinivas Sathiraju
(74) *Attorney, Agent, or Firm* — Leydig, Voit & Mayer, Ltd.

(57) ABSTRACT

A plasma source (100), comprises an outer face (10) with an aperture (14) for delivering a plasma from the aperture. A transport mechanism is configured to transport a substrate (11) and the plasma source relative to each other parallel to the outer face, with a substrate surface to be processed in parallel with at least a part of the outer face that contains the aperture. First (4-1) and second tile (4-2) are arranged within a first plane of a working electrode (22) with neighbouring edges (12) bordering a first plasma collection space (6-1) and a third tile (4-3) is arranged in a second plane of the working electrode parallel to the first plane such that the third tile overlaps neighbouring edges in the first plane. At least one of the working and counter electrodes comprises a local modification (13,15) near said neighbouring edges to (Continued)

increase a plasma delivery to the aperture compensating for loss of plasma collection due to the neighbouring edges.

16 Claims, 6 Drawing Sheets

(56) References Cited

U.S. PATENT DOCUMENTS

| | | | | |
|---|---|---|---|---|
| 7,323,401 | B2* | 1/2008 | Ramaswamy | H01L 21/0337 |
| | | | | 427/523 |
| 7,767,024 | B2* | 8/2010 | Kao | H01L 21/02104 |
| | | | | 438/715 |
| 8,329,557 | B2* | 12/2012 | Brailove | H01L 21/76254 |
| | | | | 257/E21.345 |
| 9,131,595 | B2* | 9/2015 | Creyghton | H05H 1/2439 |
| 11,274,369 | B2* | 3/2022 | Um | H01L 21/02164 |
| 11,352,696 | B2* | 6/2022 | Creyghton | C23C 16/45504 |
| 2002/0097295 | A1 | 7/2002 | Toda et al. | |
| 2005/0205110 | A1* | 9/2005 | Kao | C23C 14/022 |
| | | | | 134/1.1 |
| 2005/0281959 | A1 | 12/2005 | Song | |
| 2006/0162741 | A1 | 7/2006 | Kurunczi | |
| 2006/0238133 | A1* | 10/2006 | Horsky | H01L 21/26566 |
| | | | | 315/111.81 |
| 2006/0273265 | A1 | 12/2006 | Lipson | |
| 2007/0176115 | A1* | 8/2007 | Horsky | H01L 21/26513 |
| | | | | 250/427 |
| 2010/0175987 | A1* | 7/2010 | Creyghton | H05H 1/2406 |
| | | | | 422/186.29 |
| 2010/0196626 | A1* | 8/2010 | Choi | H01J 37/32091 |
| | | | | 427/569 |
| 2011/0236599 | A1* | 9/2011 | Furuta | H01J 37/32091 |
| | | | | 118/723 E |
| 2011/0287193 | A1* | 11/2011 | Creyghton | C23C 16/545 |
| | | | | 118/723 R |
| 2012/0000609 | A1* | 1/2012 | Do | C23C 16/505 |
| | | | | 307/154 |
| 2012/0164834 | A1* | 6/2012 | Jennings | H01L 21/67201 |
| | | | | 118/723 R |
| 2012/0180954 | A1* | 7/2012 | Yang | H01J 37/32449 |
| | | | | 156/345.33 |
| 2013/0337657 | A1* | 12/2013 | Savas | C23C 16/509 |
| | | | | 118/723 MP |
| 2015/0048739 | A1* | 2/2015 | Forster | H01J 37/32357 |
| | | | | 315/111.21 |
| 2015/0255243 | A1* | 9/2015 | Godet | H01J 37/32899 |
| | | | | 156/345.39 |
| 2016/0289836 | A1 | 10/2016 | Jansen et al. | |
| 2017/0137939 | A1* | 5/2017 | Creyghton | H01J 37/32825 |
| 2021/0296094 | A1* | 9/2021 | Creyghton | C23C 16/45563 |

FOREIGN PATENT DOCUMENTS

| | | |
|---|---|---|
| FR | 88569 E | 2/1967 |
| JP | 2002-018276 A1 | 1/2002 |
| KR | 10-0723019 B1 | 5/2007 |
| WO | WO 2008/038901 A1 | 4/2008 |
| WO | WO 2013/110963 A1 | 8/2013 |
| WO | WO 2015/067729 A1 | 5/2015 |
| WO | WO 2015/199539 A1 | 12/2015 |

OTHER PUBLICATIONS

European Patent Office, Written Opinion/ISA in corresponding International Application No. PCT/EP2014/073998 (6 pages).

* cited by examiner

Fig. 1a  Fig. 1b  Fig. 1c  Fig. 1d

PLASMA SOURCE AND METHOD OF OPERATING THE SAME

CROSS-REFERENCE TO RELATED APPLICATIONS

This patent application is a U.S. National Phase of PCT International Application No. PCT/NL2019/050383, filed Jun. 20, 2019, which claims priority to European Application No. 18179096.5, filed Jun. 21, 2018, which are both expressly incorporated by reference in their entireties, including any references contained therein.

FIELD OF THE INVENTION

The invention relates to a plasma source device, in particular of the kind comprising collection spaces in communication with an aperture, from which plasma can be delivered to a surface of a substrate to be processed. Such a device is known from WO2015199539. In the device a first plasma collection space is formed at least in part between a first face of a counter electrode and a first face of a working electrode, and a second plasma collection space is at least in part formed between a second face of the counter electrode and a second face of a working electrode opposite the first face of the working electrode.

BACKGROUND

Plasma treatment of surfaces has many useful applications, including discharging of surfaces, modification of surface energy improving wettability or adhesion of materials as paints glues and other coatings, the cleaning and/or deactivation of bacterial cells on surfaces as well as being included as part of larger assemblies for surface treatments used in for example semi-conductor industry, such as chemical vapor deposition, plasma etching, atomic layer deposition and atomic layer etching devices. Plasma collection spaces as disclosed in WO2015199539 are formed between a central planar tile-shaped high voltage electrode that is encapsulated by a dielectric barrier and is placed at a distance in between a pair of grounded outer electrode faces. Using a suitable gas flow from an inlet, the plasma generated in these spaces may be transported to the aperture from which it is delivered to the surface of a substrate to be processed. WO2015199539 uses a ceramic dielectric barrier layer on the high voltage electrode to obtain a controlled low current density which is essential for the plasma homogeneity. The ceramic is formed from high density polycrystalline ceramic material.

The delivery to a substrate can be made effective and homogeneous by careful control over important parameters, such as thickness, composition and roughness of the dielectric layer, shape of the external electrodes, width of the aperture, and angle of plasma delivery. It is important to note that in the reported arrangement the plasma generated in both spaces contributes to the total flux of plasma delivered from the aperture.

Plasma sources disclosed in WO2015199539 have been implemented in surface treatment tools and used, for example, in deposition processes for indium (gallium) zinc oxide semiconductors and low-temperature thin-film encapsulation layers; both processes may potentially find application in, for example, OLED display manufacturing. WO2008038901 discloses a plasma generator that is used to treat a substrate by generating a plasma under atmospheric pressure and leading the generated plasma out of a plasma generation space to bring the plasma into contact with the surface of the substrate.

An important goal of future generation manufacturing processes is treatment of increasingly large surfaces; e.g. surfaces with a width of up 0.5 to 3 meters. For this purpose, some plasma treatment tools aim for plasma sources capable of homogeneous plasma deposition over the entire width of such surfaces. This poses a challenge because up-scaling of current plasma sources to e.g. 3 m width is difficult in view of strict dimensional tolerances for e.g. the ceramic elements (thickness, flatness and roughness) that are e.g. within 10 or 20 micrometer and in view of the wide range of temperatures from 20 to 350° C. in which the plasma source should be applicable.

Figure 1A:
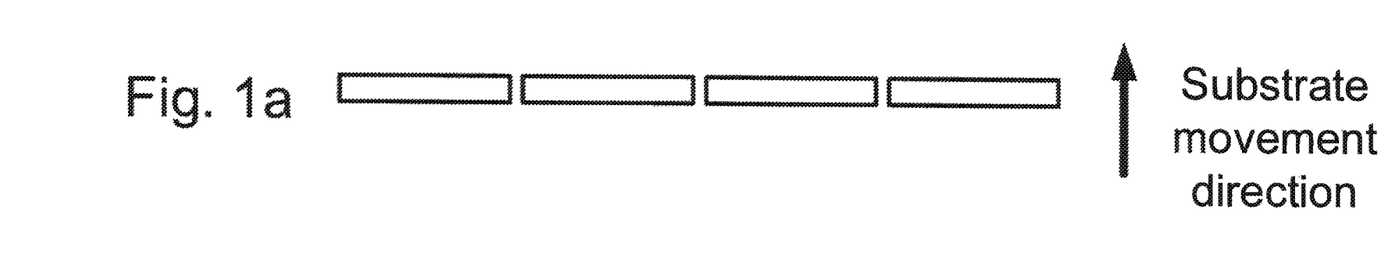
Figure 1B:
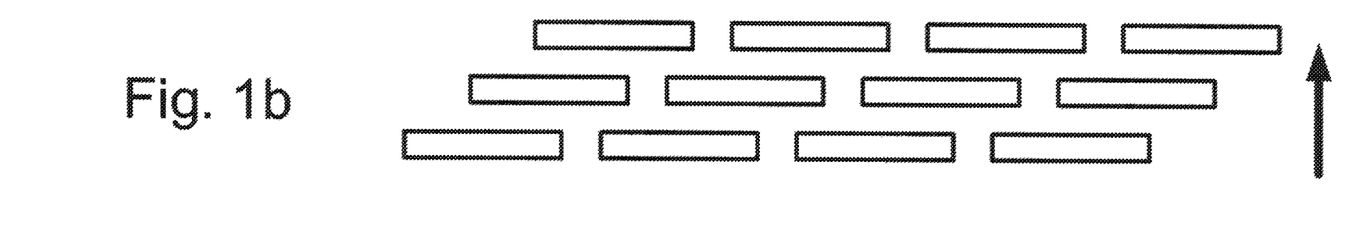
Figure 1C:
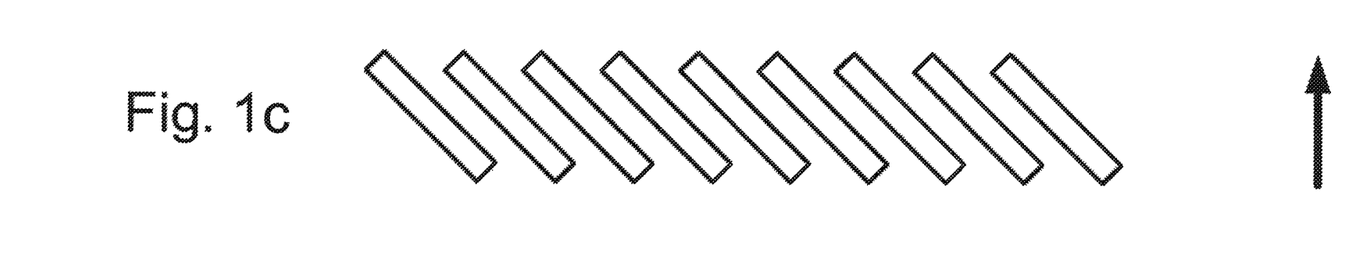
Figure 1D:
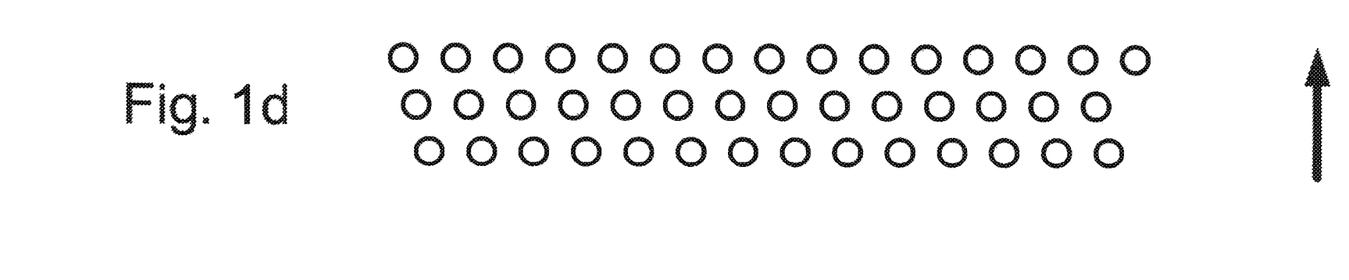

In order to facilitate the treatment of large substrates by plasma species, devices have been proposed comprising a multitude of elements arranged in a linear array (See FIG. 1a). However, in case a linear array of elements is used, no plasma is delivered to areas of the substrate that are passing under the boundary between such individual elements. Multiple rows of linear arrays may me constructed with each consecutive row shifted as to form overlapping treatment elements, as disclosed in WO02094455A1. Or alternatively, as described in US20160289836A1 disclosing an arrangement in which individual elements in an array may be arranged in an imbricated way in the direction of the row, i.e. like shingles on a roof. However, both disclosures fail to a greater or lesser extent in their objective to provide homogeneity in plasma delivery to a substrate due to the remaining presence of areas affected by the interface between individual elements and or cover a large portion of the substrate in the transport direction. This is cumbersome, since substrates are sensitive to prolonged heating at elevated temperatures, and there are also cost constraints that aim to minimize the extent of the plasma delivery systems. Therefore, the orientations of FIGS. 1b-d may provide more homogenous delivery, but may also suffer from prolonged exposure to elevated temperatures. With increasing number of elements this creates a problem that needs to be solved. In one aspect, the present invention aims to overcome these disadvantages while enabling the homogeneous treatment of larges surfaces.

Among others, it is an object to provide for a plasma source and/or a surface processing apparatus for efficient transport and homogeneous delivery of short-living reactive plasma species at the surface of a substrate.

SUMMARY

A plasma source according to claim 1 is provided.

The plasma source comprises an outer face with at least one aperture for delivering a plasma from the aperture. A transport mechanism is configured to transport a substrate and the plasma source relative to each other parallel to the outer face, with a substrate surface to be processed in parallel with at least a part of the outer face that contains the aperture. A counter electrode comprises at least a first and second largely parallel oriented face that extend in a direction away from the substrate, and a working electrode comprising multiple planar shaped tiles, in which a tile comprises at least one film shaped conductive layer that is at least in part enclosed by a dielectric layer. At least two plasma collection spaces are in communication with the at least one aperture, wherein a first plasma collection space is formed at least in part between a first face of the counter electrode and a first face of the working electrode, and a second plasma collection space is at least in part formed between a second face of the counter electrode and a second face of the working electrode. A gas inlet provides gas flow to the aperture through at least two plasma collection spaces. First and second tile are arranged within a first plane of the working electrode with neighbouring edges bordering said first plasma collection space and a third tile is arranged in a second plane of the working electrode parallel to the first plane such that the third tile overlaps said neighbouring edges in the first plane. At least one of the working and counter electrodes comprises a local modification near said neighbouring edges to increase a plasma delivery to the aperture compensating for loss of plasma collection due to the neighbouring edges.

In an embodiment the modification comprises providing a geometric modification to the second face of the counter electrode at a location alongside said neighbouring edges in said first plane. The modification may enhance a gas flow, so that more plasma can be produced at the location where, on the opposite side of the tile, plasma generation is hampered.

In another embodiment said local modification comprises providing a geometric modification to the film shaped conductive layer of a tile overlapping an adjacent edge. Specifically, the film shaped conductive layer may be partly oriented along a transport direction of the substrate, wherein the film shaped conductive layer comprises an extension in a direction oriented along a transport direction of the substrate, away from said neighbouring edges, as to enlarge the area of the working electrode to which plasma may be associated at a location in line with the adjacent edge. By compensating the shape of the working electrode, in particular, its bottom face, the generation of plasma can be promoted by extension of the conductive layer, to compensate for the reduced generation near the neighbouring edges. It is noted that the transport direction of the substrate relative to the surface processing apparatus may be reversed, in a reciprocating fashion.

The plasma source is particularly suitable for use in atomic layer deposition (ALD) where a substrate is repetitively exposed to a sequence of reactants (at least two) providing surface limited growth of a layer. The plasma source can be used to provide one or more of the successive reactants and a series of plasma sources may be used. The plasma source providing very reactive plasma species makes it possible to reduce the space and/or the time needed for co-reactants to react with the surface until saturation. This allows to increase the substrate speed in spatial ALD processing. In other embodiments, the plasma source may be used for other atmospheric pressure plasma surface treatment applications where chemical reactive plasma species (radicals, ions, electronically and vibrationally excited species) are needed to react with the surface. Examples of such applications are cleaning or etching by oxidation (for example using O radicals) or reduction (using H radicals), activation for adhesion improvement and plasma-enhanced chemical vapor deposition (PECVD).

The gas composition may comprise $N_2$, $O_2$, $H_2$, $H_2O$, NO, $H_2O_2$, $NH_3$, $N_2O$ or $CO_2$ and mixtures to produce radicals such as N, O, H, OH and NH.

BRIEF DESCRIPTION OF THE DRAWINGS

These and other objects and advantageous aspects will become apparent from a description of exemplary embodiments with reference to the following figures.

FIG. 1 (*a-d*) shows a schematic view of stacked plasma delivery arrangements, for producing a homogeneous deposition on a substrate;

DETAILED DESCRIPTION OF EXEMPLARY EMBODIMENTS

Figure 2A:
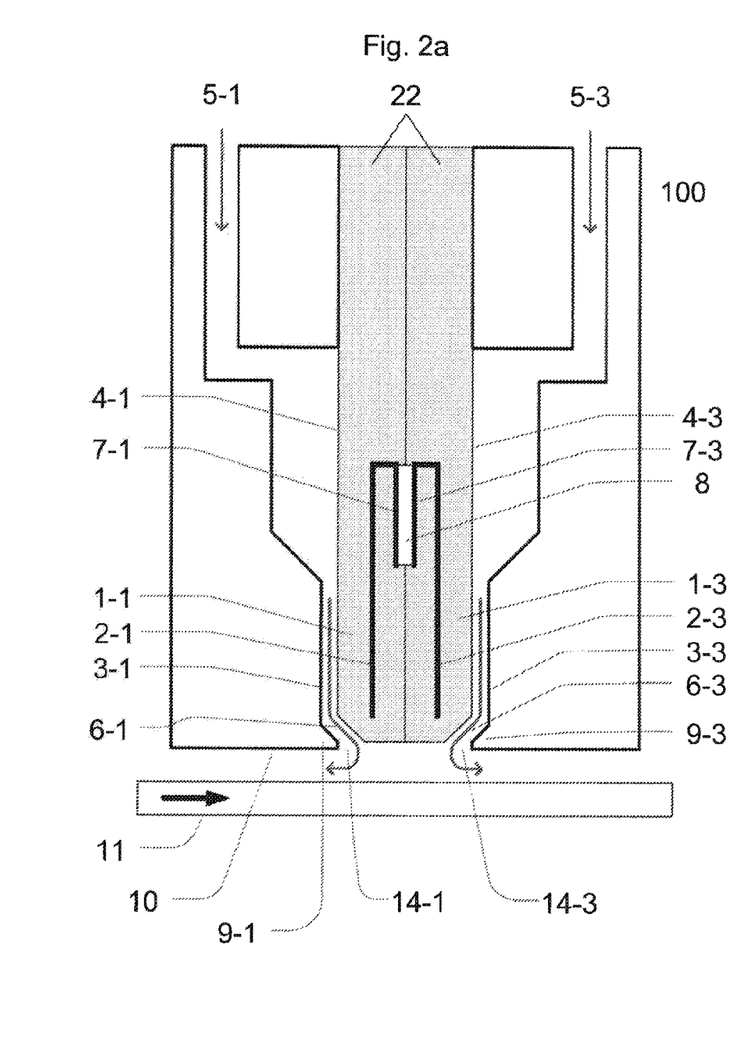
FIG. 2*a-c* shows side views of the plasma source in one modification.

FIG. 2*a* shows a cross-section of an exemplary embodiment of a surface processing apparatus 100 for processing a substrate 11. Substrate 11 may be part of a flexible foil or a rigid plate such as a semi-conductor wafer for example. In the illustrated embodiment the surface processing apparatus has a flat planar outer face 10 that faces substrate 11, but alternatively a curved shape may be used. In exemplary embodiments the distance between outer face 10 and substrate 11 is in the range of 0.01 to 0.2 mm or at most 0.5 mm. Apertures 14-1, 14-3 in outer face 10 are used to feed atmospheric plasma (6-1, 6-3) to the space between substrate 11 and outer face 10. As used herein atmospheric means not effectively vacuum, e.g. between 0.1 and 10 Bar. In an embodiment apertures 14-1, 14-3 are 0.1 mm wide but this may depend on design specifics. Apertures 14-1, 14-3, which may also be referred to as nozzles, extend along a line perpendicular to the plane of the drawing. The surface processing apparatus comprises a transport mechanism for moving substrate 11, a first and second counter electrode 3-1, 3-3 of electrically conductive material (preferably grounded or at the same potential as the substrate if the substrate is not grounded), dielectric tiles 4-1, 4-3 comprising electrically conductive material forming a working electrode 22 that is oriented at a central location between the two faces 3-1, 3-3 of the counter electrode and comprising multiple planar shaped tiles 4-1, 4-3. A tile comprises a film shaped conductive layer 2-1, 2-3 that is at least in part enclosed by a dielectric layer 1-1, 1-3. A plasma collection space is formed between counter electrode 3-1, 3-3 and opposite sides of the tiles 4-1, 4-3 forming the working electrode 22. The working electrode is positioned central to the aperture and extends away therefrom, and depending on the bottom geometry, may effectively form two apertures 14-1, 14-3 of sideways extending plasma collection spaces 6-1, 6-3 on opposite sides of the tiles 4-1, 4-3, in the form of slits, having the two plasma collection spaces effectively in communication with the aperture 14 or with respective aperture slits 14-1, 14-3. The counter electrode may be formed by stainless steel, Titanium (preferred), or conductive ceramic, e.g. hydrogen doped SiC. Transverse to the plane of drawing counter electrode 3-1, 3-3, the working electrode 22 extends at least along the length of aperture 14. In addition, the surface processing apparatus may comprise an electric alternating or pulsed voltage generator (not shown) coupled to counter electrodes 3-1, 3-3 and conductive layers 2-1, 2-3 being part of the working electrode 22 for applying an electric field between working electrode 22 on one hand and counter electrodes 3-1, 3-3 on the other. Alternatively, an electric voltage generator external to the surface processing apparatus may be used.

Transport mechanism for substrate 11 is shown only symbolically. By way of example, it may comprise a conveyor belt for transporting substrate 11, or a table and a motor to drive the table, or a roll to roll (R2R) mechanism may be used comprising a first and second of rotating roll from which a substrate 11 such as a foil is rolled off and onto respectively. In other embodiments the transport mechanism may comprise a motor to move substrate 11 with respect to the assembly of working electrode 22 and counter electrodes 3-1, 3-3 or vice versa. In another embodiment the electrodes may be integrated in a rotating drum, aperture 14 exhausting from the surface of the drum, in which case the transport mechanism may comprise a motor to directly or indirectly drive rotation of the drum.

Counter electrodes 3-1 and 3-3 have wedge shaped portions 9-1, 9-3, each of which ends in a pointed edge at aperture 14.

The pointed edge at the bottom of tiles 4-1, 4-3 may be partly supported by spacer elements in the aperture, to ensure a proper interdistance of the plasma collection space. This is important for a suitable creation of (non-filamented) plasma. By way of example wedge shaped portions 9-1, 9-3 with flat surfaces are shown, but alternative curved surfaces may be used. First and second wedge shaped portions 9-1, 9-3 made of stainless steel may be used for example. The fact that the portion has a wedge shape means that its upper and lower surface converge toward the pointed edge, i.e. that their distance decreases. If the upper and lower surfaces run in a flat plane from the edge they are at angle to each other, the angle being larger than zero degrees and less than ninety degrees, preferably between ten and sixty degrees, more preferably less than forty five degrees and even more preferably thirty degrees or less. If a curved upper or lower surface is used, there is of course no fixed angle but preferably in the orthogonal cross section lines from the edges to points on the surface at a distance of three mm from the pointed edge are at angles in the range described for flat planes.

In an exemplary embodiment, the lower surfaces of the wedge shaped portions 9-1, 9-3 lie in a single flat plane and form the outer face 10 of the surface processing apparatus that faces substrate 11.

Working electrode 22 has a surface alongside or parallel to the face parts of the wedge shape 9-1, 9-3 forming the counter electrodes 3-1, 3-3. Dielectric layer 1-1, 1-3 covers the surface of working electrode 22, for example, an aluminum oxide dielectric layer may be used. In an embodiment working electrode 22 may be realized as a film electrode covered by dielectric layer 1-1, 1-3. The dielectric layer 1-1, 1-3 may be an integral part of tile 4-1, 4-3. Dielectric barrier discharge plasma collection spaces are located in the gas volume between counter electrode 3-1, 3-3 and working electrode 22 where the distance between counter electrode and dielectric layers 1-1, 1-3 is relatively small. The lower surface of dielectric layer 1-1, 1-3 fits a V-shaped aperture, leaving thin flat planar plasma collection spaces for plasma fluid flows in plasma collection spaces 6-1, 6-3 between the lower surface of dielectric layer 1-1, 1-3 and the upper surfaces of first and second wedge shaped portion 9-1, 9-3 of the counter electrode. Preferably, the distance between the lower surface of dielectric layer 1-1, 1-3 and the upper surfaces of first and second wedge shaped portions 9-1, 9-3 are constant within these plasma collection spaces. The dielectric barrier discharge plasma generated in the plasma collection spaces 6-1, 6-3 may extend outside of these plasma collection spaces as surface dielectric barrier discharge (SDBD) plasma to surface portions of dielectric layers 1-1, 1-3 directly facing the substrate. Keeping the total width of aperture 14 sufficiently small, the ionizing plasma is not transferred to a substrate even when this substrate is conductive and at very small distance. In this way, remote SDBD plasma can be effectively generated at very short distance from the substrate without using the substrate as electrode. This is important for applications where a high radical flux is needed without damaging the substrate by direct plasma. The optimum width of the aperture depends on the spatial gap between the dielectric layer 2 of working electrode 22 and the substrate. For a gap between working electrode and substrate in the range 0.1-0.3 mm, the possible width of the aperture 14 avoiding direct plasma to the substrate is in the range 0.5-2.0 mm, preferably 0.7-1.5 mm.

In operation, an alternating or pulsed high electric voltage difference is applied between conductive layers 2-1, 2-3 of the working electrode 22 and counter electrodes 3-1, 3-3 by a generator (not shown). The counter electrodes 3-1, 3-3 may be kept at a constant potential, e.g. ground potential, and a high frequency potential may be applied to conductive layers 2-1, 2-3. A gas which may be a pure gas or a mixture of gases ($N_2$, $O_2$, $H_2O$, $H_2O_2$, NO, $N_2O$, $H_2$, $NH_3$, $CO_2$ etc.) is supplied through gas inlets 5-1, 5-3 and flows from gas inlets 5-1, 5-3 to aperture 14 via the planar plasma collection spaces between the working electrode 22 and the counter electrodes 3-1, 3-3. The high-frequency electric field in these spaces resulting from the voltage differences ionizes the gas, creating plasma. It was found that nitric oxide (NO), may be used in combination with an other gas or gasses (such as $N_2$) to enhance radical density, e.g. in the plasma collection spaces.

Alternatively or in addition, NO may added to reduce gas flow rates needed to operate the proposed plasma apparatus.

The ionized gas flows into aperture 14, where it forms an atmospheric plasma, i.e. a plasma in a gas of considerable pressure. Atmospheric plasma tends to extinguish quickly, even within a period of the high frequency electric voltage. As result, the plasma has to be re-initiated periodically during each half cycle of an applied alternating or pulsed voltage. Plasma may contain free electrons, ions, electronic and vibrational excited molecules, photons and radicals besides neutral molecules. Many of the plasma species are chemical reactive and can be denoted as Reactive Plasma Species (RPS). The nature and concentration of RPS depend on gas composition and electrical plasma conditions. Furthermore, fast recombination processes cause strong variations of RPS both as function of space and as function of time. Other examples of RPS are electronic or vibrational excited atoms and molecules. The plasma, containing significant concentrations of RPS, flows through aperture 14 and from there laterally through the space between substrate 11 and outer face 10 to both sides of aperture 14. Below aperture 14, and to some extent aside of it, the RPS interact with the surface of substrate 11.

The thickness of dielectric layer 1-1, 1-3 is selected so that it is at least thick enough to avoid discharge through dielectric layer 1-1, 1-3. There is no fundamental upper limit to the layer thickness, but to keep the high-frequency electric voltage required to sustain the plasma low, the thickness is preferably not much more than an acceptable minimum value. In exemplary embodiments a thickness in a range of 0.1 to 2 mm is used, e.g. 0.15 mm. The dielectric barrier can be obtained from extruded tubes e.g. ceramic tubes or from ceramic coated metal tubes. Tubular structures offer high intrinsic mechanical strength. Shapes can also be squared, hexagonal, etc. Two or more surfaces are machined to comply with the mechanical tolerances required for the gap distance between working electrode 22 and counter electrodes 3-1, 3-3. In a practical embodiment, the working electrode is oriented at a central location between two opposite faces of the counter electrode 3-1, 3-3 and comprising multiple planar shaped tiles 4, in which a tile comprises one or more film shaped conductive layers 2-1, 2-3 that are at least in part enclosed by a dielectric layer 1-1, 1-3. For example, in a Low Temperature Cofired Ceramics process, a tile 4 can be manufactured by layerwise stacking of green ceramic sheets wherein a conductive layer is buried and coupled by vias. In stead of sheetwise manufacture, also slib casting or injection moulded ceramics may be used, wherein a form can be moulded in shape before finalizing. Also it is possible to use a 3D printing technique.

A single gas source (not shown) may be used coupled to both inlets 5-1, 5-3. The gas source may comprise sub-sources for the different components of the gas and a gas mixer with inputs coupled to the sub-sources and outputs coupled to inlets 5-1, 5-3.

The gas flow rate from inlets 5-1, 5-3 (e.g. mass or volume per second) may be selected dependent on the desired rate of reactive plasma species on substrate 11. In an example a rate of 1000-2000 cubic mm per second, per mm length of aperture per inlet is used, or in a corresponding mass flow range obtained by assuming a pressure of one atmosphere and a temperature of 25 degrees centigrade.

The gas flow speed through the spaces between the working electrode 22 and counter electrodes 3-1, 3-3 corresponds to the flow rate divided by the cross-section area of the spaces (thickness times width). By keeping the cross section area small, a high flow speed is realized. High flow speed has the advantage that less loss will occur due to recombination of radicals and ions prior to reaction on substrate 11.

Figure 2B:
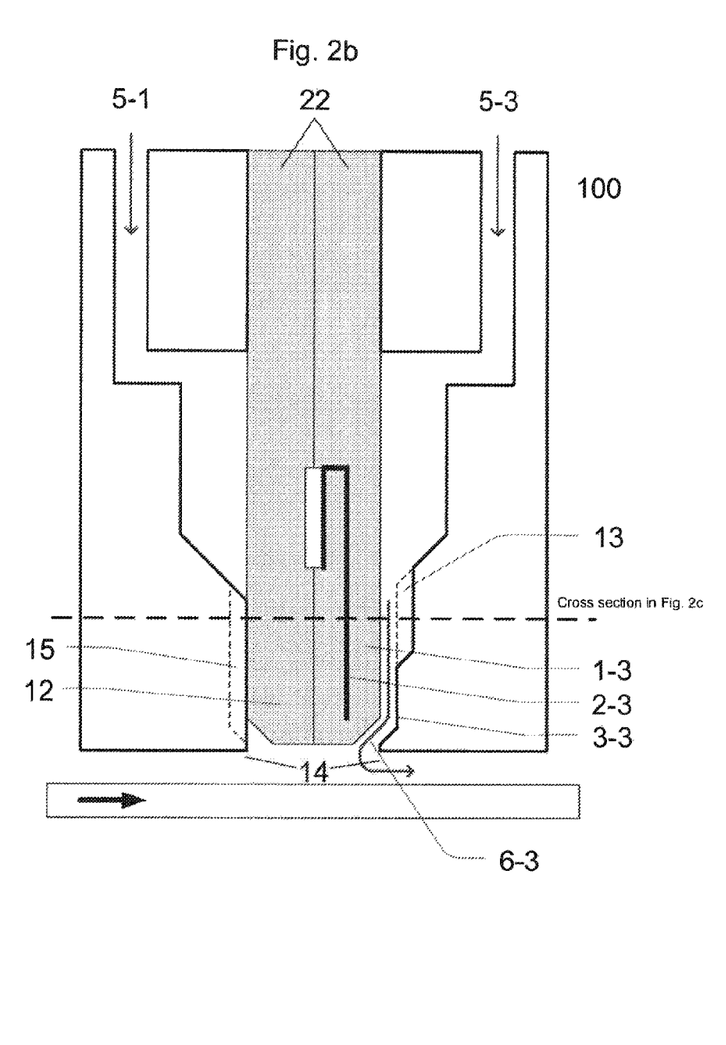

FIG. 2b shows essentially the same cross sectional view on the plasma source apparatus, but at a sectional position where the tile 4-1 ends and an adjacent edge shows no sectional conductive layer, in contrast to visible layer 2-3 of the opposite tile 4-3 that extends in that sectional position. The view of FIG. 2c further clarifies this, as it shows a sectional view perpendicular to the plane of view in FIGS. 2a and 2b.

Indeed it can be shown that the tiles 4-1, 4-2 have neighbouring edges 12, where in a sectional view of FIG. 2b only a single electrode 4-3 is shown that overlaps the adjacent edge of the other tile. Note that tile 4-2, like tiles 4-1 and 4-3 comprises a film shape conductive layer (interior electrode) 2-2 and forms a plasma collection space 6-2 between the tile and counter electrode.

The sectional view in FIG. 2b shows in the counter electrode 3-3 a local modification 13 near the neighbouring edges 12 to increase a plasma delivery to the aperture 6-3 compensating for loss of plasma collection due to the neighbouring edges 12. In the example the modification is provided by a geometric modification to the face of the counter electrode 3-3 at a location alongside said neighbouring edges 12. More particularly, said geometric modification comprises providing a groove at said location in said second face so as to increase a gas flow rate via the second plasma collection space down-stream of said groove. The groove has the function of increasing the flow rate in the plasma collection space opposite the space bordering the neighbouring edges. Advantageously, the plasma in the plasma collection space is saturated, so by increasing the flow, a linear increase of density of chemical reactive plasma species is provided downstream of the plasma collection space. This can be conveniently provided by selecting the channel length of the groove 13, ending at a position away from the aperture. Near the aperture, preferably, the slit is planar in shape having a prescribed gap width. By increasing the plasma rate at the opposite side, by groove 13, the plasma delivery in the aperture 14 can be equalized. While the embodiment shows a groove structure 13 as a local modification other flow enhancing structures may be designed such as a depression in the working electrode 22. Preferably the groove (trench) does not extend to the end of the angle shaped counter electrode 3-3. Reducing the length (in direction of gas flow) of the narrow part of the plasma volume is sufficiently effective for increasing the mass flow rate through this volume. The gas flow through the plasma volume downstream of the trench is mainly determined by the factor $h^3/L$ of the narrow part (with small h) and thus can be increased by reducing L of this narrow part.

Providing a plasma collection space 6-3 ending in aperture 14-3 with a constant and relatively small slit width has important advantages:

Applied electric field conditions in this section with increased gas mass flow are identical to the applied field conditions in the two neighboring sections. The homogeneity of dielectric barrier discharge plasma is strongly dependent on electric field homogeneity and little influenced by a locally increased flow.

The widths of the aperture 14-3 can be kept smaller than a (minimum) distance between the substrate and the plasma source. In practical operation of upscaled systems (large substrate width R2R, S2S) the injector to substrate gap may vary in a range of 0.1-0.3 mm. Thus enlarging the plasma slit gap (h) at the end of the plasma collection space 6-3 to larger values is not desirable to prevent gas transport in aperture 14 in the direction perpendicular to substrate movement.

An alternative way to obtain uniform gas distribution along the length of the slit, is to use a porous dielectric material, permeable for gas and having a small pore size. In this gas the 'gap' (h) filled with the porous dielectric may have a larger width, typically in the range 0.3-1.0 mm and pores with a size smaller than this range. The porous layer may be manufactured as a layer on the dielectric barrier, being integral part of the tiled dielectric barrier elements 4 provided, the dielectric material encapsulating the interior electrodes (2-1, 2-3) is non-porous, with high density and voltage insulating.

Furthermore, it is shown that at the side opposite the groove 13, bordering the plasma collection spaces 6-1, 6-3 near the neighbouring edges 12, the working electrode has a protrusion 15. The protrusion 15 limits gas flow near the neighbouring edges 12 of the tiles 4-1 and 4-2 and balances the overall cross section flow to obtain an even flow distribution along the length of the aperture. The protrusion is formed by a single ridge, e.g. partly running along the neighbouring edges 12, but can be also a more complex partial constriction in the plasma collection space alongside the neighbouring edges thus reducing the gas flow in the plasma collection space at a location downstream of neighbouring edges 12. When contacting the working electrode 22 the protrusion 15 may define a small length and high precision of this length (0.1+/−0.01 mm) of the plasma gas gap between counter electrode 3-1, 3-3 and dielectric barrier tiles 4-1, 4-3. By closing of this ridge non-plasma activated gas flow is avoided near the ends of linear dielectric elements where no plasma can be generated.

Figure 2C:
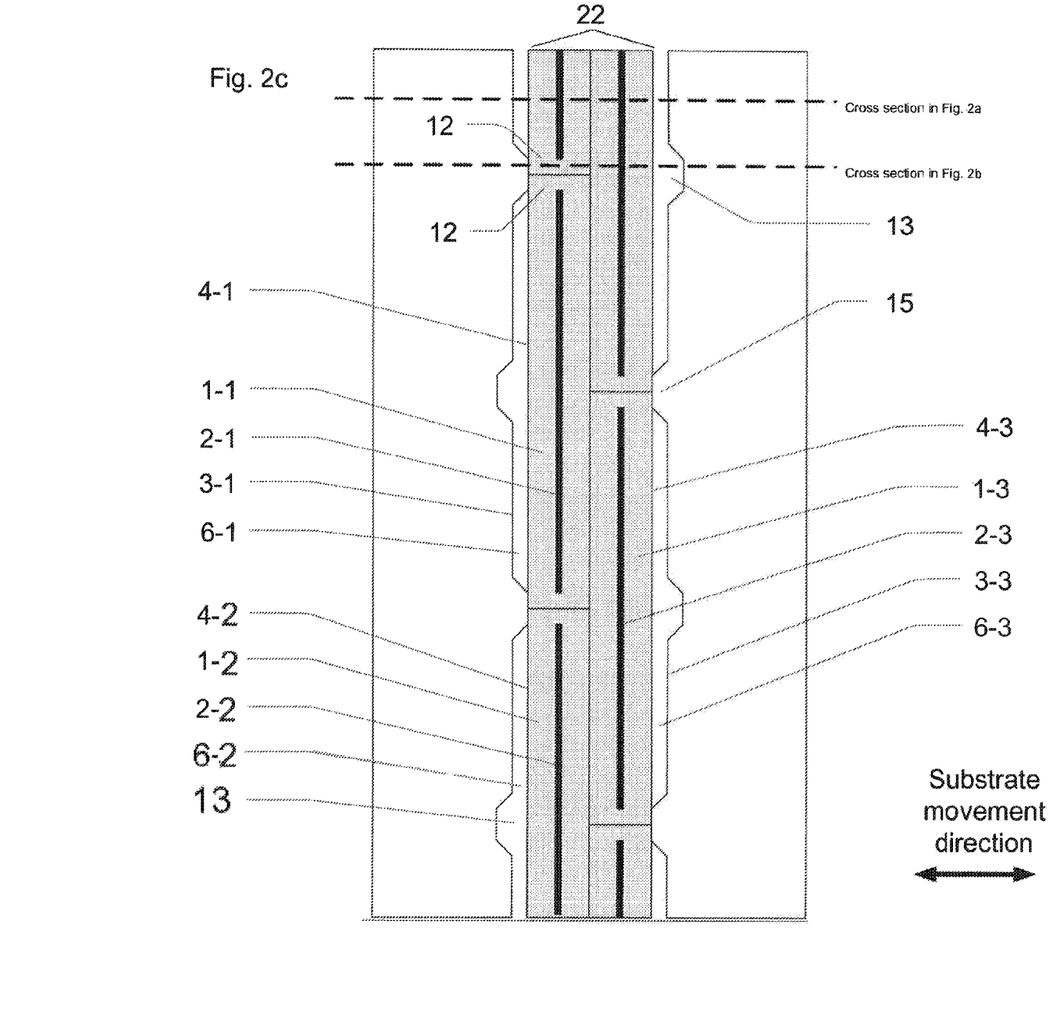

In another aspect of the invention, FIGS. 2a-c show that tiles 4-1, 4-3 have an exterior electrically conductive contact area 7-1, 7-3 coupled to the film shaped conductive layer 2-1, 2-3 by a via connection. The conductive area 7-1, 7-3 may be integral to the tile, in a manner so that tiles 4-1, 4-2, 4-3 can be arranged in a stack with contact area 7-1 of a first tile 4-1 in electrically conductive contact with the contact area 7-3 of an opposing tile 4-3 so that said film shaped conductive layer in said tiles can share an effectively identical electric potential. Alternatively a solid metal strip 8 can be used to connect contact areas 7-1, 7-3, and the contact area 7-2 of tile 4-2 to share an effectively identical potential. Note that the contact area 7-2 of tile 4-2 is not depicted in the cross-section views of FIGS. 2a-b. As can be seen from FIG. 2c, tile 2 and its respective contact area is present in a direction out of plane of the images in FIGS. 2a-b.

Figure 3A:
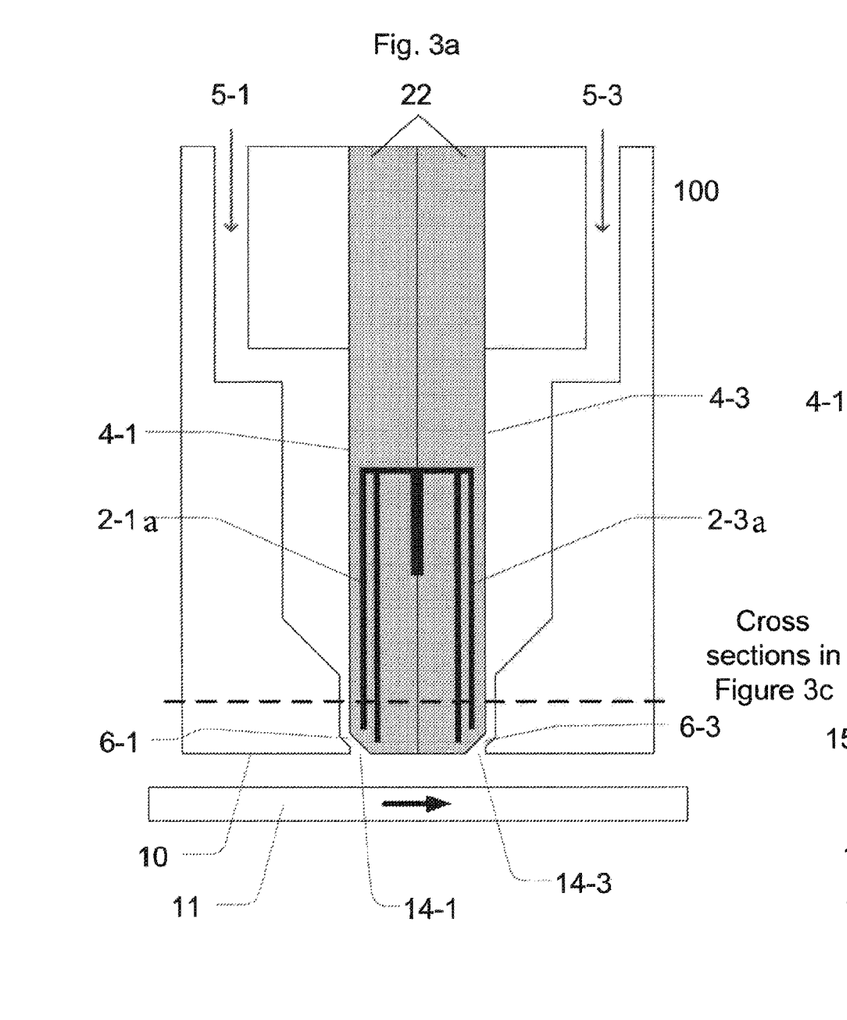
FIG. 3*a-c* shows side views of the plasma source in another modification.
Figure 3B:
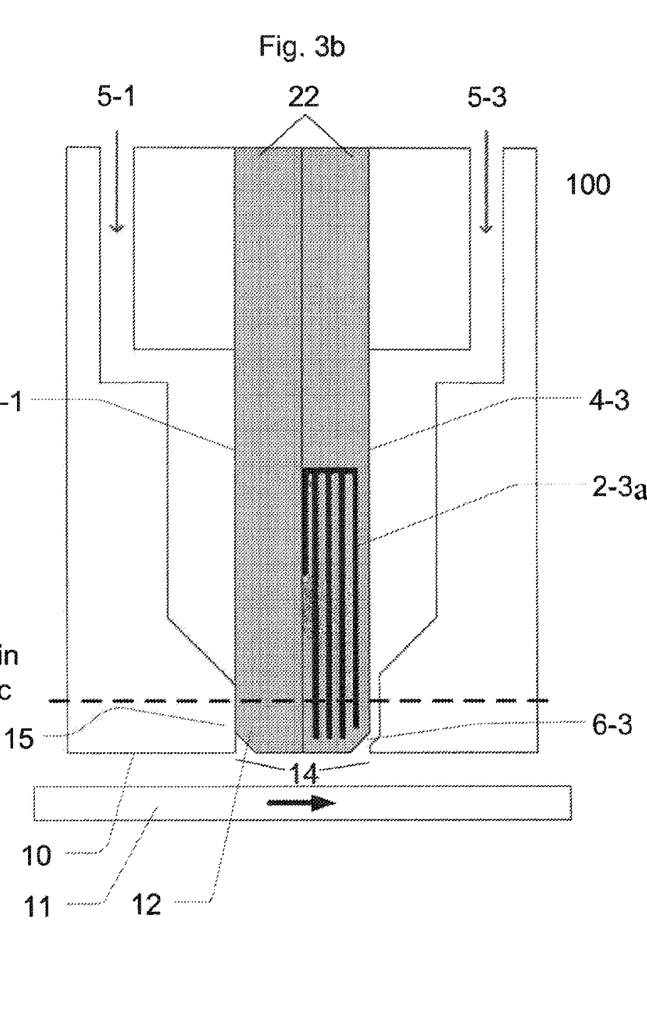
Figure 3C:
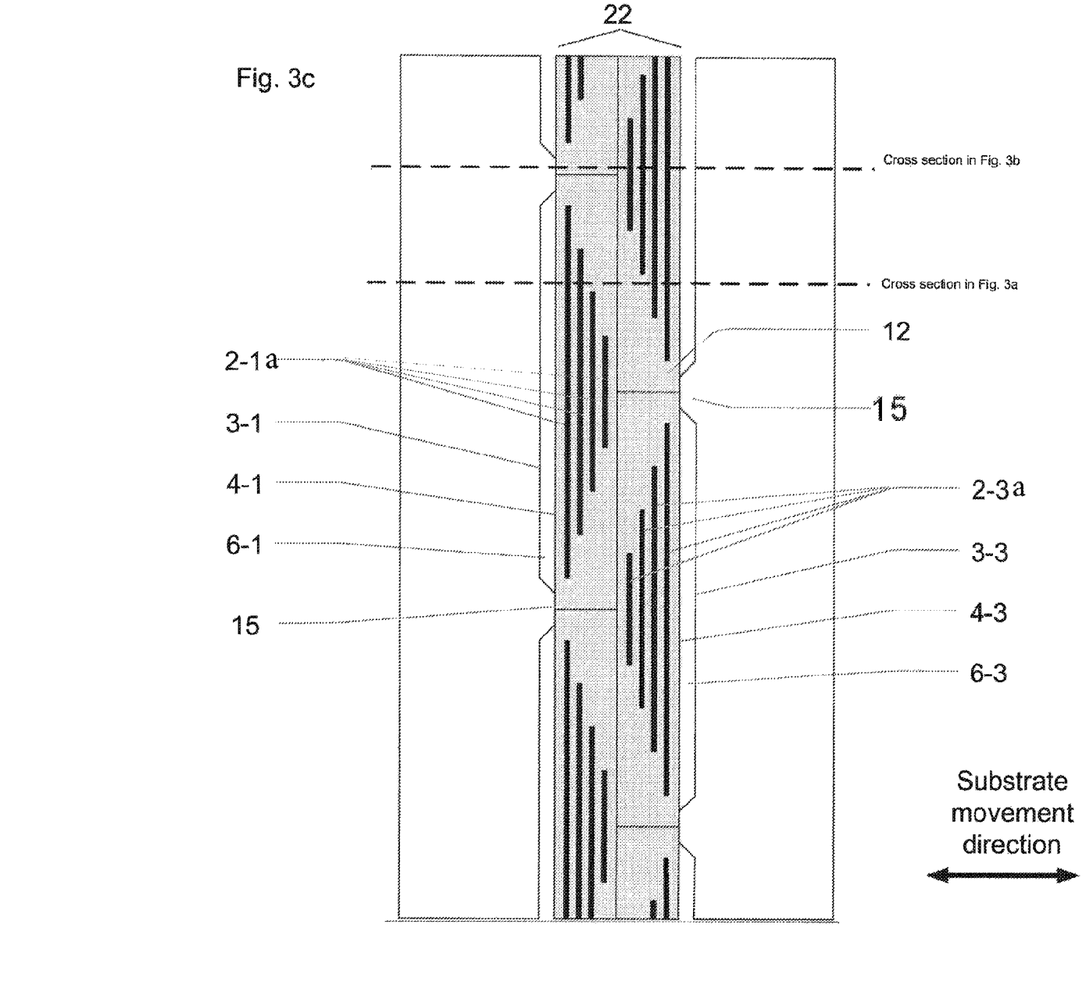

FIG. 3a-c show another example of a local modification near the neighbouring edges of two tiles arrayed in a plane to increase a plasma delivery to the aperture compensating for loss of plasma collection due to the neighbouring edges. Said local modification comprises providing an extension to the film shaped conductive layer in a tile overlapping an adjacent edge, that is partly oriented along a transport direction of the substrate. It is shown in FIG. 3a that the extension can be realized by adding conductive layers in parallel, electrically interconnected by vias.

As shown in FIG. 3a, parallel planar shaped conductive layers 2-1a, 2-3a with different sizes and positions within the dielectric tiles 4-1, 4-3 can be used to control the thickness of the dielectric layer at the bottom of the tiles facing edge shaped portions 9-1, 9-3 of counter electrodes 3-1, 3-3. This is important for obtaining a sufficient homogeneous electric field distribution in the plasma collections spaces 6-1, 6-3 to generate plasma uniformly. Two parallel conductive layers of different size in each tile are shown in FIG. 3a but a larger number of parallel conductive layers can be used to improve the homogeneity of the applied electric field in plasma collection spaces.

Ceramic tiles with interior and exterior conductive films can be produced using co-firing techniques where a stack of ceramic sheets and printed metal films is assembled first and then fired for obtaining a monolithic metal-ceramic structure. Typically the distance between conductive layers is in the range 0.1-1.0 mm, preferably 0.2-0.5 mm. The thickness of printed co-firing layers is preferably in the range 0.1-0.2 mm. The metal films preferably possess a continuous line shaped edge but away of this edge the metal films do not need to be closed. Patterned metal films may improve the mechanical and voltage insulating properties of the final co-fired structure.

FIG. 3b shows a cross section, similar to the cross section shown in FIG. 3a but at a different position along the aperture 14 near the edge 12 of dielectric tile 4-1. Due to absence of conductive layers near the edges of tiles 4-1, 4-2, less or no plasma will be generated at this location. The loss of plasma collection is compensated by adding more conductive layers in the opposite tile 4-3 at the location of the edge.

As shown in FIGS. 3a and 3b, conductive layers 2-1a, 2-3a within each tile 4-1, 4-3 are connected to contact layers 7-1, 7-3 present on a central portion of exterior surface of tiles. Contact areas of opposite tiles are used to supply the same high frequency voltage to all conductive layers of successive dielectric tiles, forming a working electrode 22.

FIG. 3c shows a different cross section of the working electrode 22 and counter electrodes 3-1, 3-3. Different conductive layers positioned in parallel within a dielectric tile have different length in the direction of the elongated aperture 14. The absence of plasma collection near the edges 12 of tiles 4-1 and 4-2, is compensated by additional conductive layers in the opposite tile 4-3. As visualized in the cross section shown in FIG. 3c, multiple conductive layers in the working electrode 22 can be used to form triangular shaped plasma formation areas. The length of the plasma formation area in the direction of substrate movement gradually increases towards a location in line with an adjacent edge. Thus a plurality of film shaped conductive layers are provided in the tile, at least in part enclosed by a dielectric barrier facing the substrate. The film shaped layers 2-1a have edges along a length of the aperture 14 to form a pattern of parallel edges across the width of the aperture. As can be seen eg. at reference numeral 2-1a a width of the pattern across the aperture is increased towards a location in line with an adjacent edge.

In this embodiment plasma may not only be formed in plasma collection spaces 6-1, 6-3 in FIG. 3a, but may extend according to the size and position of parallel conductive films to a volume in between the bottom face of dielectric tiles 4-1, 4-3 and the substrate. As a result, a relatively strong electrical interaction between the plasma and the substrate may occur depending on substrate conductivity and whether a conductive substrate is connected to a fixed potential or electrically floating.

The assembly of parallel conductive layers improves the plasma homogeneity in particular in the direction of the elongated aperture 14. By using multiple conductive layers in dielectric tiles a uniform distribution of the plasma produced reactive radical flux towards a moving substrate is obtained.

The plasma generated within aperture 14 at the bottom face of dielectric tiles 4-1, 4-3 results in a high radical flux which is predominantly governed by gas diffusion and much less by gas flow. Nevertheless, the use of a gas flow through plasma collection spaces 6-1, 6-3 towards the substrate 11, causes favorable conditions (electrons, negative ions, energetically excited molecules) for extension of homogeneous plasma in the aperture 14.

The plasma formed in the relatively wide aperture 14 may be referred to as 'plan-parallel' plasma independent on the specific type of electrical interaction with dielectric, earthed conductive or floating potential conductive substrates.

Though the radical flux of this plan-parallel plasma to the substrate is principally diffusion controlled, flow transport through the plan-parallel section will enlarge the reaction zone to a surface area larger than aperture 14, extending to the volume between the outer face (10) of the counter electrodes (3-1, 3-3). Transport by flow will be caused by the drag flow caused by relative movement between the substrate 11 and the outer face 10 of the surface processing apparatus 100. It is advantageous to further control the flow directionality in the volume between plasma injector and substrate. Flow directionality control is possible by using different pressure induced plasma gas flow rates via gas inlets 5-1 and 5-3 and plasma collection spaces 6-1 and 6-3. It is advantageous to use pressure induced gas flow and substrate movement induced drag flow in the same direction thus not counteracting each other. When the substrate transport direction is reversed in a reciprocating fashion, it is desirable to change the relative gas flow rates through gas inlets 5-1 and 5-3 accordingly.

Figure 4:
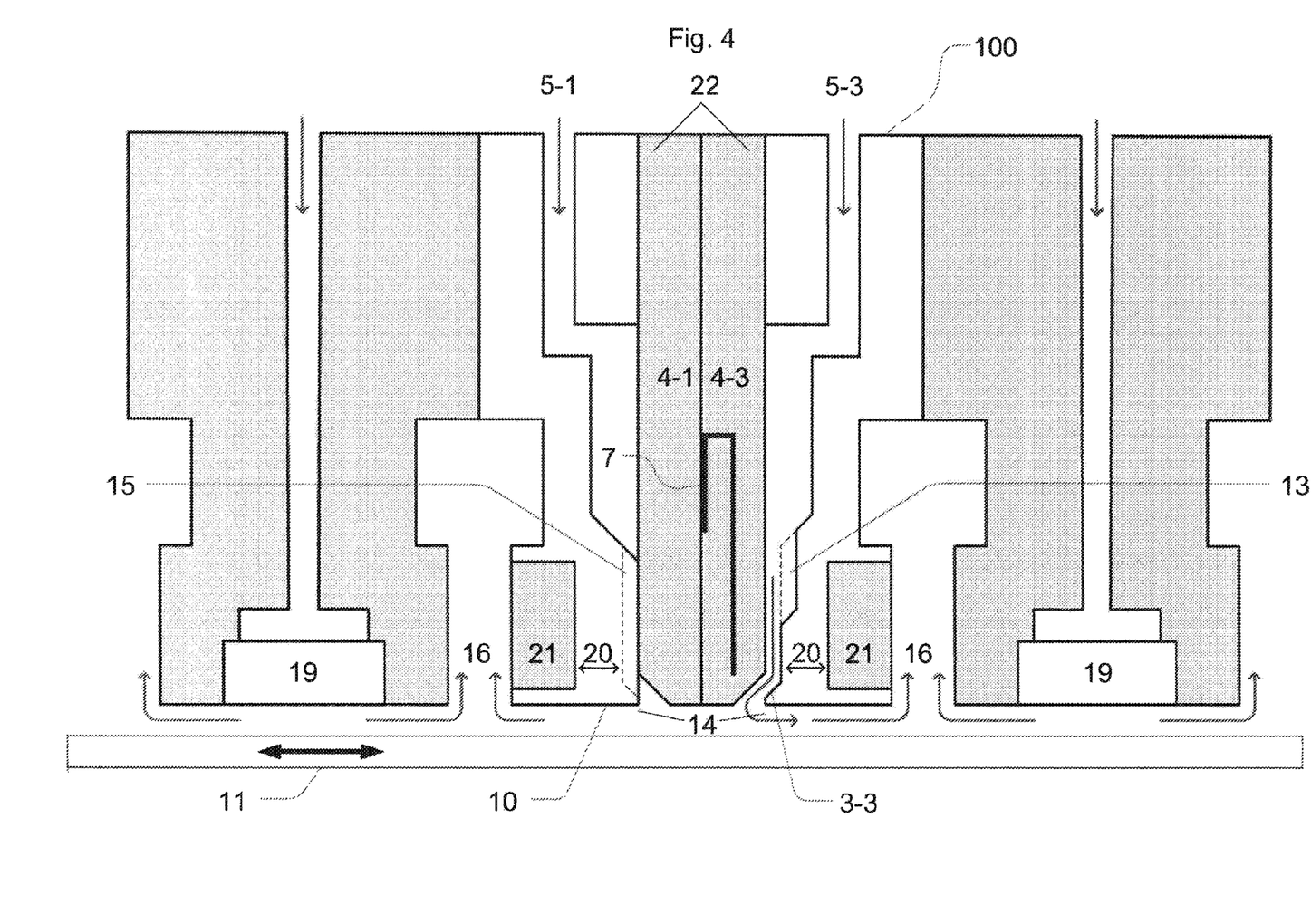
FIG. 4 shows another embodiment.

FIG. 4 shows an alternative embodiment of the surface processing apparatus 100 where the plasma source has been integrated in an injector head providing purge gases and exhausts. This type of injector head is particularly useful in spatial atomic layer deposition or spatial atomic layer etching (spatial ALD/ALE) where thin layers are deposited or etched passing them along a series of gas injectors and exhaust channels. In spatial ALD a substrate is exposed sequentially to a coating precursor gas (e.g. trimethylaluminum (TMA) or trimethylindium (TMI)), purge gas to remove the non-surface-reacted precursor gases ($N_2$), the co-reactant (e.g. plasma generated radicals) and finally purge gas to remove the non-surface-reacted compounds (e.g. $O_3$, $H_2O$, $H_2O_2$).

In spatial ALD/ALE applications it is important to reduce the size of the injector head. This is possible by using an injector head as shown in FIG. 4 comprising the plasma source according to the invention. The width of the working electrode 22 is made relatively small with ceramic dielectric tiles 4-1, 4-3 providing a central electrical contact 7 which can be connected via an electrical connection strip 8 to an external high frequency voltage generator at a lateral location outside of the plasma treatment zone defined by the length of aperture 14. The width of the working electrode is in typically the range 2-4 mm.

As most types of radicals react very fast by gas phase recombination and on surfaces, the useful length of radical exposure along the flat surface of counter electrodes 3-1, 3-3 and outside aperture 14, is several mm at maximum.

The embodiment of the surface processing apparatus and plasma source as shown in FIG. 4 is particularly compact and well-suited for treating a moving substrate within a short period of plasma exposure time.

The small length of the working electrode 22 and counter electrodes 3 offers an additional benefit. The reactive plasma can be used as heat source enhancing the reactivity of plasma reactive species. Nearby exhaust channels 16 and purge gas injectors 19 allow for rapid cooling of the substrate top-surface layer after plasma exposure. Additional features of the surface processing apparatus and integrated plasma source allow a more effective gas heating by means of the plasma source. The width 20 of the counter electrode 3 can be made small limiting heat conduction losses from the bottom part of the plasma source to the injector head. In addition an insulating material 21, e.g. a ceramic material can be used to limit heat conduction losses.

It is emphasized that the thermally enhanced plasma injector is not intended for high temperature (thermal plasma). The increase of temperature reached by the dielectric barrier discharge plasma source is in the range 20-100° C. Depending on gas flow rate and plasma power, in turn determined by the used voltage and frequency supplied by the electrical power generator, practical reached values of the temperature increase are 20-50° C. As example, the heated DBD plasma source in operation can be used to process PET foil or any other temperature sensitive substrate at an average foil temperature of 100° C. using the injector head to rapidly layer-by-layer anneal the substrate top surface at 120-150° C.

Where the term dielectric layer has been used, it should be appreciated that this layer need not have the same thickness everywhere. Although embodiments have been described wherein gas from the aperture additionally can be used to create a gas bearing between the outer face of the first electrode and the substrate, it should be appreciated that such a gas bearing is not always necessary. It is very useful if the substrate is a flexible foil, but when a rigid substrate is used (i.e. a substrate that does not deform to an extent that the distance to the outer face can vary significantly, e.g. more than twenty percent) another way of maintaining a distance between the outer face and the substrate may be used, such as contact spacers adjacent to ends of the aperture.

The present application pertains to the clauses 'a' through 'o' listed below. It will be appreciated that aspects of these clauses may be combined with other aspects of the invention, e.g. as described in the claims. For example a plasma source as described in clause 'a' wherein said tiles comprise an exterior electrically conductive contact area coupled to the film shaped conductive layer; and wherein said tiles are arranged in a stack so that the contact area of a first tile is in electrically conductive contact with the contact area of an opposing tile may be combined with aspects of various embodiments of plasma sources wherein at least one of the working and counter electrodes comprises a local modification near said neighbouring edges to increase a plasma delivery to the aperture compensating for loss of plasma collection due to the neighbouring edges.

By providing the tiles in the plasma source with an exterior electrically conductive contact area coupled to the film shaped conductive layer tiles in a stack may contact so that said film shaped conductive layer in said tiles can share an effectively identical electric potential. Further, providing exterior electrically conductive contact areas may reduce the width of the working electrode 22 relatively small with ceramic dielectric tiles 4-1, 4-3 providing a central electrical contact 7 which can be connected via an electrical connection strip 8 to an external high frequency voltage generator at a lateral location outside of the plasma treatment zone defined by the length of aperture 14.

CLAUSES a. A plasma source, comprising:
an outer face, comprising at least one aperture for delivering a plasma from the aperture;
a transport mechanism configured to transport a substrate and the plasma source relative to each other parallel to the outer face, with a substrate surface to be processed in parallel with at least a part of the outer face that contains the aperture;
a counter electrode comprising at least a first and second largely parallel oriented face that extend in a direction away form the substrate;
a working electrode comprising at least two at least partially overlapping planar shaped tiles, in which a tile comprises a film shaped conductive layer that is at least in part enclosed by a dielectric layer;
at least two plasma collection spaces in communication with the at least one aperture, wherein a first plasma collection space is formed at least in part between a first face of the counter electrode and a first face of the working electrode, and a second plasma collection space is at least in part formed between a second face of the counter electrode and a second face of the working electrode;
a gas inlet to provide gas flow to the aperture through at least two plasma collection spaces;
wherein said tiles comprise an exterior electrically conductive contact area coupled to the film shaped conductive layer; and
wherein said tiles are arranged in a stack so that the contact area of a first tile is in electrically conductive contact with the contact area of an opposing tile.

b. The plasma source according to clause a, wherein said electrically conductive connection is provided by an electrically conducting via.

c. The plasma source according to clause a, wherein said electrically conductive connection is provided by a strip of the film shaped conductive layer that runs along an outer face of said tile to said exterior electrically conductive contact area.

d. The plasma source according to clause a, wherein said stack further comprises a conductive plate element provided between the exterior electrically conductive contact areas of opposing tiles.

e. The plasma source according to clause a, wherein for a counter electrode the width of the face of said counter electrode that is nearest the surface of a substrate to be processed along the direction of movement of said substrate is provided in a range 1-4 mm in order to reduce a heat transfer from said electrode to said substrate to be processed.

f. The plasma source according to any of clauses a-e, wherein
within the stack a first (4-1) and second tile (4-2) are arranged within a first plane of the working electrode with neighbouring edges (12) bordering said first plasma collection space and a third tile (4-3) is arranged in a second plane of the working electrode parallel to the first plane such that the third tile overlaps said neighbouring edges in the first plane; and
wherein at least one of the working (22) and counter electrodes (3-1, 3-3) comprises a local modification near said neighbouring edges to increase a plasma delivery to the aperture compensating for loss of plasma collection due to the neighbouring edges.

g. The plasma source according to clause f, wherein said local modification comprises a geometric modification provided to the second face of the counter electrode at a location alongside said neighbouring edges in said first plane.

h. The plasma source according to clause g, wherein said geometric modification comprises a groove (13) provided at said location in said second face so as to increase a gas flow rate via the second plasma collection space down-stream of said groove.

i The plasma source according to clause h further comprising a partial constriction (15) provided in the first plasma collection space alongside the neighbouring edges thus reducing the gas flow in the first plasma collection space at a location downstream of said neighbouring edges.

j. The plasma source according to clause i, wherein said partial constriction compromises a ridge (15) provided in the first face of the counter electrode at a location alongside said neighbouring edges.

k. The plasma source according to clause f, wherein said local modification comprises a plurality of film shaped conductive layers (2-1a, 2-3a) provided in the tile, at least in part enclosed by a dielectric barrier facing the substrate, wherein the film shaped layers have edges along a length of the aperture to form a pattern of parallel edges across the width of the aperture.

l. The plasma source according to clause claim k, wherein said pattern has a width across the aperture that gradually increases towards a location in line with an adjacent edge.

m. The plasma source according to clause f, wherein said local modification comprises an extension provided to the film shaped conductive layer of a tile overlapping an adjacent edge, that is partly oriented across a width of the aperture.

n. The plasma source according to clause m, wherein the length of said extension gradually increases towards a location in line with an adjacent edge.

o. The plasma source according to clause f, wherein said geometric modification comprises a reduced thickness of the dielectric barrier to a tile in the second plane at a location alongside said neighbouring edges in order to locally increase the electric field strength.

The invention claimed is:

1. A plasma source (100), comprising:
an outer face (10), comprising at least one aperture (14) for delivering a plasma from the aperture;
a transport mechanism configured to transport a substrate (11) and the plasma source relative to each other along the outer face;
a counter electrode comprising at least first (3-1) and second faces (3-3) that extend in a direction away from the substrate;
a working electrode (22), comprising multiple planar shaped tiles (4-1, 4-2, 4-3), in which a tile comprises at least one film shaped conductive layer (2-1, 2-2 2-3) that is at least in part enclosed by a dielectric layer (1-1, 1-2, 1-3);
at least two plasma collection spaces in communication with the at least one aperture, wherein a first plasma collection space (6-1) is formed at least in part between a first face of the counter electrode and a first face of the working electrode, and a second plasma collection (6-3) space is at least in part formed between a second face of the counter electrode and a second face of the working electrode;
a gas inlet (5) to provide gas flow to the aperture through the at least two plasma collection spaces;
wherein a first (4-1) and second tile (4-2) are arranged within a first plane of the working electrode with neighbouring edges (12) bordering said first plasma collection space and a third tile (4-3) is arranged in a second plane of the working electrode parallel to the first plane such that the third tile overlaps said neighbouring edges in the first plane; and
wherein at least one of the working (22) and counter electrodes comprises a local modification near said neighbouring edges to increase a plasma delivery to the aperture compensating for loss of plasma collection due to the neighbouring edges.

2. The plasma source according to claim 1, wherein said local modification comprises a geometric modification provided to the second face of the counter electrode at a location alongside said neighbouring edges in said first plane.

3. The plasma source according to claim 2, wherein said geometric modification comprises a groove (13) provided at said location in said second face so as to increase a gas flow rate via the second plasma collection space down-stream of said groove.

4. The plasma source according to claim 3 further comprising a partial constriction (15) provided in the first plasma collection space alongside the neighbouring edges thus reducing the gas flow in the first plasma collection space at a location downstream of said neighbouring edges.

5. The plasma source according to claim 4, wherein said partial constriction compromises a ridge (15) provided in the first face of the counter electrode at a location alongside said neighbouring edges.

6. The plasma source according to claim 1, wherein said geometric modification comprises a reduced thickness of the dielectric barrier to a tile in the second plane at a location alongside said neighbouring edges in order to locally increase the electric field strength.

7. The plasma source according to claim 1, wherein said local modification comprises a plurality of film shaped conductive layers (2-1a, 2-3a) provided in the tile, at least in part enclosed by a dielectric barrier facing the substrate, wherein the film shaped layers have edges along a length of the aperture to form a pattern of parallel edges across the width of the aperture.

8. The plasma source according to claim 7, wherein said pattern has a width across the aperture that gradually increases towards a location in line with an adjacent edge.

9. The plasma source according to claim 1, wherein said local modification comprises an extension provided to the film shaped conductive layer of a tile overlapping an adjacent edge, that is partly oriented across a width of the aperture.

10. The plasma source according to claim 9, wherein the length of said extension gradually increases towards a location in line with an adjacent edge.

11. The plasma source according to any of the previous claims wherein said tiles are further comprising an exterior electrically conductive contact area (7-1, 7-3) in electrical connection with the film shaped conductive layer and wherein said tiles are arranged in a stack so that the contact area of a first file is in electrically conductive contact with the contact area of an opposing tile so that said film shaped conductive layer in said tiles share an effectively identical electric potential.

12. Device according to claim 11, wherein said electrically conductive connection is provided by an electrically conducting via.

13. Device according to claim 11, wherein said electrically conductive connection is provided by a strip of the film shaped conductive layer that runs along an outer face of said tile to said exterior electrically conductive contact area.

14. Device according to claim 11, wherein said stack further comprises a conductive plate element (8) provided between the exterior electrically conductive contact areas of opposing tiles.

15. Device according to claim 11 wherein for a counter electrode the width of the face of said counter electrode that is nearest the surface of a substrate to be processed along the direction of movement of said substrate is provided in a range 1-4 mm in order to reduce a heat transfer from said electrode to said substrate to be processed.

16. Method of operating a device according to claim 1 at an operation temperature above a maximum service temperature of a substrate to be processed wherein said operation temperature is in a range 20-100° C. above said service temperature.

* * * * *